United States Patent
Watanabe

(10) Patent No.: US 7,366,035 B2
(45) Date of Patent: Apr. 29, 2008

(54) FERROELECTRIC MEMORY AND METHOD OF DRIVING THE SAME

(75) Inventor: Kenya Watanabe, Suwa (JP)

(73) Assignee: Seiko Epson Corporation (JP)

(*) Notice: Subject to any disclaimer, the term of this patent is extended or adjusted under 35 U.S.C. 154(b) by 65 days.

(21) Appl. No.: 11/223,600

(22) Filed: Sep. 9, 2005

(65) Prior Publication Data

US 2006/0114740 A1  Jun. 1, 2006

(30) Foreign Application Priority Data

Nov. 26, 2004  (JP)  ............................ 2004-342122

(51) Int. Cl.
*G11C 5/14* (2006.01)

(52) U.S. Cl. .................. 365/189.09; 365/145
(58) Field of Classification Search ........... 365/189.09, 365/145
See application file for complete search history.

(56) References Cited

U.S. PATENT DOCUMENTS 6,430,093 B1 * 8/2002 Eliason et al. ......... 365/189.11
6,667,896 B2 * 12/2003 Rickes et al. ............... 365/145
6,912,175 B2 * 6/2005 Noro ...................... 365/230.06
7,085,190 B2 * 8/2006 Worley et al. ......... 365/230.06

FOREIGN PATENT DOCUMENTS

JP  2001-283583  10/2001

* cited by examiner

Primary Examiner—Amir Zarabian
Assistant Examiner—Kretelia Graham
(74) Attorney, Agent, or Firm—Harness, Dickey & Pierce, P.L.C.

(57) ABSTRACT

A ferroelectric memory includes: a memory cell array in which a plurality of memory cells are disposed, a plurality of wordlines, a plurality of platelines, and a plurality of wordline driver circuits, each of the memory cells including a ferroelectric capacitor. A wordline driver circuit circuits includes: a driver DRV which drives a wordline WL; a transfer transistor TRA provided between the driver DRV and the wordline WL; and a gate control circuit. The gate control circuit performs gate control which causes the transfer transistor TRA to be turned on, and performs gate control which causes the transfer transistor TRA to be turned off, before a voltage of the wordline WL is boosted (before a plateline PL is driven) after the transfer transistor TRA has been turned on.

9 Claims, 11 Drawing Sheets

FIG. 1A
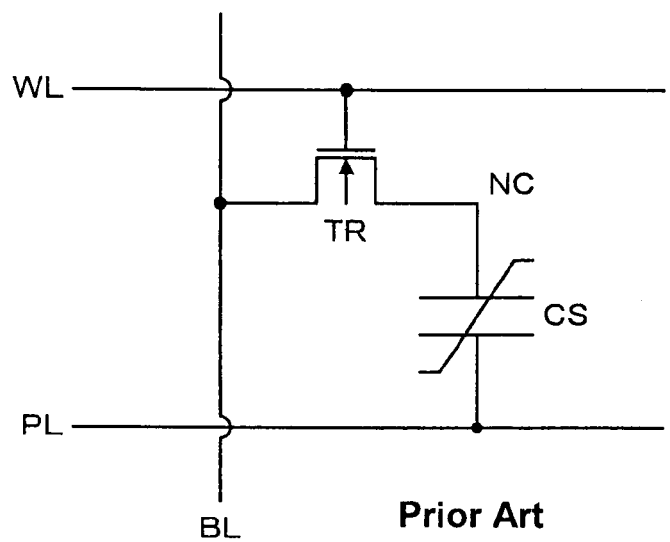
Prior Art
FIG. 1B
|  | "1" | "0" |
|---|---|---|
| BL | VCC | 0V |
| PL | 0V | VCC |
Prior Art
FIG. 1C
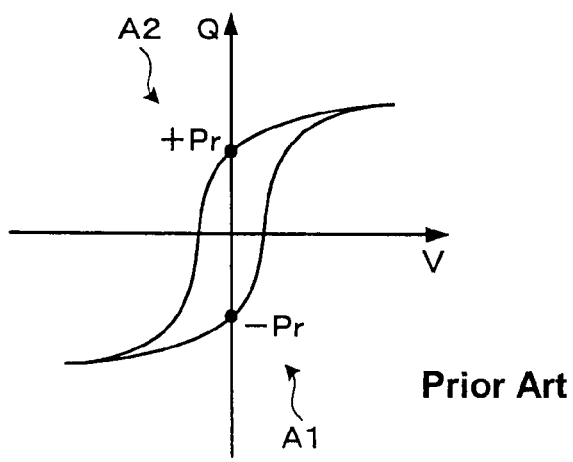
Prior Art

COMPARATIVE EXAMPLE

FIG. 11
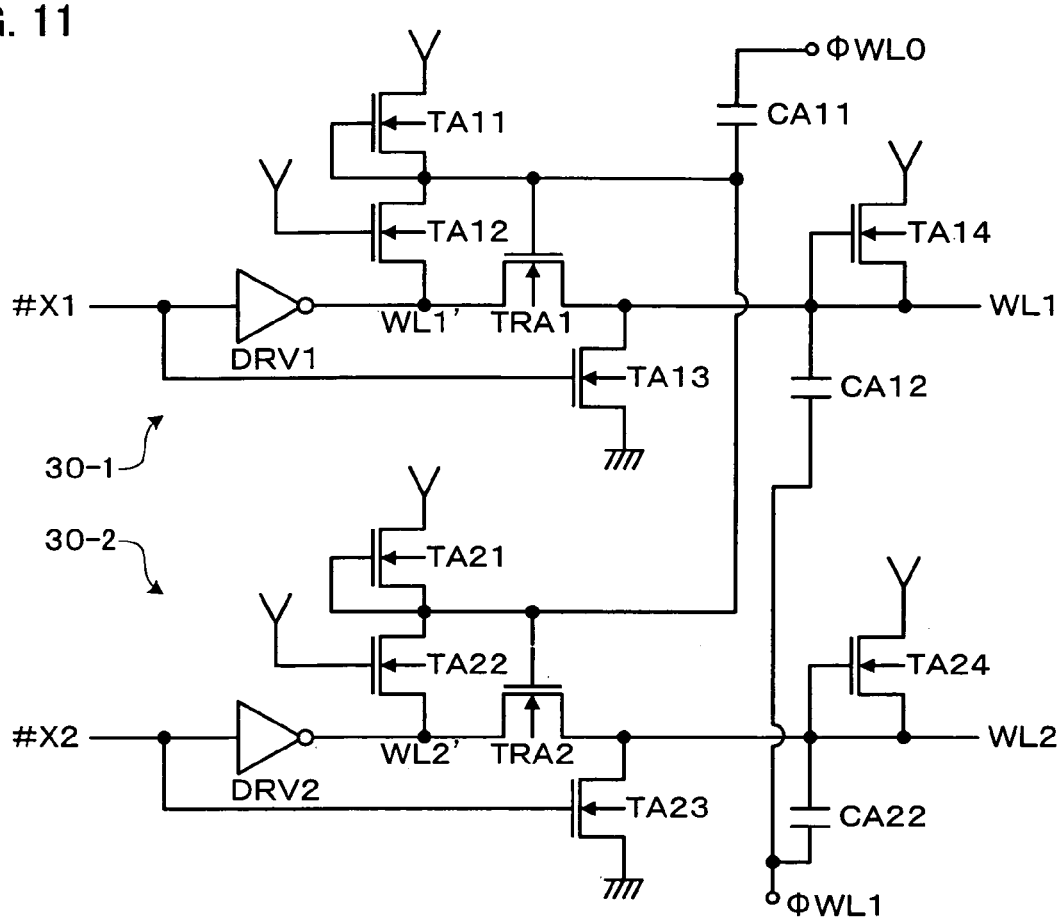
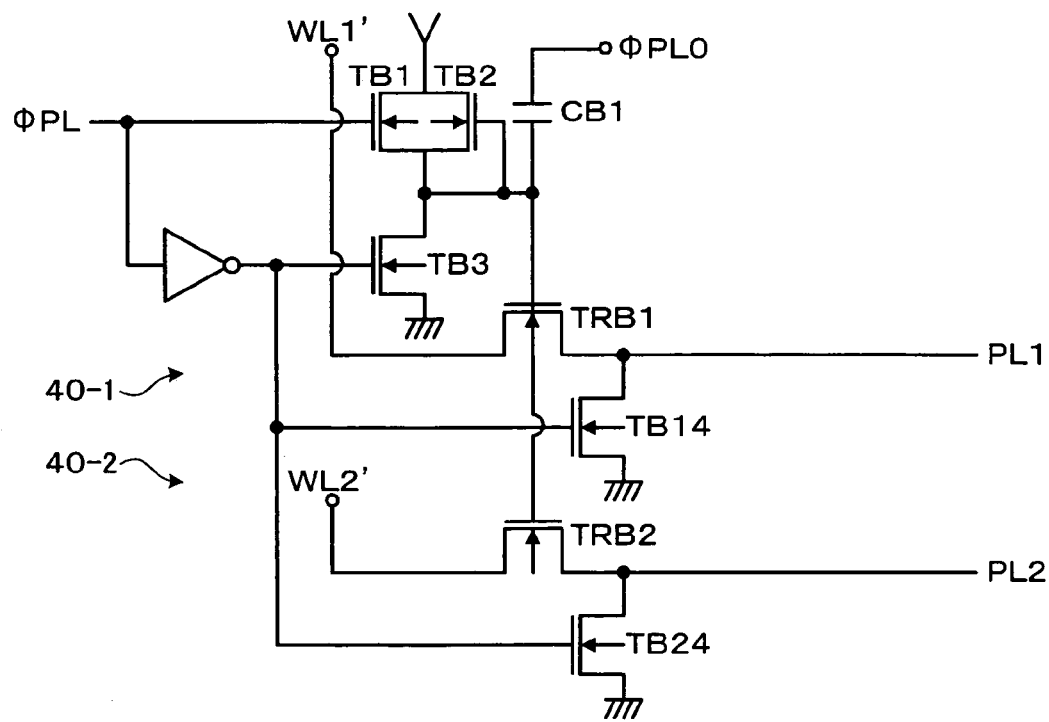

FERROELECTRIC MEMORY AND METHOD OF DRIVING THE SAME

Japanese Patent Application No. 2004-342122, filed on Nov. 26, 2004, is hereby incorporated by reference in its entirety.

BACKGROUND OF THE INVENTION

The present invention relates to a ferroelectric memory and a method of driving the same.

In recent years, a ferroelectric memory (ferroelectric random access memory (FeRAM)) using a ferroelectric capacitor as an information storage capacitor has attracted attention. The ferroelectric memory has been widely used as a memory provided to a transponder of a radio frequency identification (RFID) system.

Japanese Patent Application Laid-Open No. 2001-283583 discloses a technology for realizing a circuit which drives a wordline and a plateline of the ferroelectric memory. However, the FeRAM (ferroelectric memory) has many specific problems which do not occur in an SRAM or the like.

An example is a problem relating to a plateline (PL) driver circuit. In the FeRAM, the PL driver circuit is necessary in addition to a wordline (WL) driver circuit, differing from the SRAM.

As the WL driver circuit for the FeRAM, a circuit similar to a WL driver circuit for the SRAM may be used. In the case where the gate load (load due to the parasitic capacitance of the gate connected with the wordline) of a transfer transistor which makes up a memory cell of the FeRAM is smaller than that of the SRAM, a WL driver circuit having a drive capability lower than that of the WL driver circuit used for the SRAM may be used.

The capacitive load of the ferroelectric capacitor included in each of the FeRAM memory cells disposed along the plateline is very large, and many ferroelectric capacitors are disposed along the plateline. Therefore, the PL driver circuit may need to drive a capacitive load as large as about one picofarad (pF). In order to drive such a large load, a circuit having a drive capability higher than that of the WL driver circuit is inevitably required as the PL driver circuit used for the FeRAM. This results in an increase in the chip area.

As a signal for controlling the PL driver circuit, a decode signal used for the WL driver circuit or a WL signal which is an output signal of the WL driver circuit may be used. However, the following problem occurs when using the decode signal. Specifically, since a circuit similar to a control circuit used for the WL driver circuit is also necessary for the PL driver circuit, the circuit area is inevitably increased, whereby chip cost is increased due to an increase in chip size.

On the other hand, the following problem occurs when using the WL signal. Specifically, when using a poly-interconnect as the WL interconnect, since the PL signal cannot be generated until the WL signal rises sufficiently, it is difficult to deal with high-speed memory access. In this case, the poly-interconnect for the WL signal may be backed with an aluminum interconnect in order to increase the speed of the WL signal. However, since this method requires the aluminum backing interconnect, process cost is increased.

Moreover, since the WL driver circuit and the PL driver circuit used for the FeRAM cannot be disposed along the direction of the short side of the memory cell due to the large circuit area, the WL driver circuit and the PL driver circuit are generally disposed along the direction of the long side of the memory cell. In the case where the arrangement area of the WL driver circuit and the PL driver circuit is large and does not conform to the pitch of the memory cells in the long side direction, it is necessary to increase the size of the memory cell in the long side direction corresponding to the WL driver circuit and the PL driver circuit, or dispose the WL driver circuit on the left of the memory cell array and dispose the PL driver circuit on the right of the memory cell array. However, since the above measures increase the chip area, chip cost is further increased.

Another example is a problem relating to a write failure of a logical "1" due to the effect of the threshold voltage of the transfer transistor which makes up the memory cell.

As shown in FIG. 1A described later, the memory cell of the FeRAM includes an N-type (NMOS) transfer transistor TR and a ferroelectric capacitor CS. One end of the transfer transistor TR is connected with the bitline BL, and the other end of the transfer transistor TR is connected with one end of the ferroelectric capacitor CS. A gate of the transfer transistor TR is connected with the wordline WL. The other end of the ferroelectric capacitor CS is connected with the plateline PL.

A problem relating to the write failure of the logical "1" when setting a wordline select voltage at a voltage VCC is described below.

Consider the case of writing a logical "0" into the ferroelectric capacitor CS (the case of applying 0 V to the bitline BL and applying the voltage VCC to the plateline PL). In this case, the voltage of the other end (PL side) of the ferroelectric capacitor CS is set at the voltage VCC, and the voltage (0 V) of the bitline BL is applied to one end (node NC side) of the ferroelectric capacitor through the transfer transistor TR. As a result, a voltage +VCC with respect to the bitline BL is applied to the ferroelectric capacitor CS. Consider the case of writing the logical "1" into the ferroelectric capacitor CS (the case of applying the voltage VCC to the bitline BL and applying 0 V to the plateline PL). In this case, the other end (PL side) of the ferroelectric capacitor CS is set at 0 V, and the voltage of the bitline BL charged to the voltage VCC is applied to one end (NC side) of the ferroelectric capacitor CS through the transfer transistor TR. Therefore, the voltage which has dropped to "VCC−VTH" due to the effect of the threshold voltage VTH of the transfer transistor TR is applied to one end (NC side) of the ferroelectric capacitor CS. As a result, the logical "1" is insufficiently written into the ferroelectric capacitor CS. This causes a problem in which data "1" cannot be read, or it is difficult to write data "1" since the ferroelectric capacitor CS is continuously imprinted in the data "0" state. This poses a serious problem when the threshold voltage (VTH) of the NMOS transistor (TR) is high and the power supply voltage (VCC) is low.

As described above, the FeRAM has a problem in which it is difficult to efficiently drive the wordline and the plateline using a small circuit configuration. It is an important technical subject to solve this problem.

SUMMARY

A first aspect of the invention relates to a ferroelectric memory comprising:
- a memory cell array in which a plurality of memory cells are disposed, each of the memory cells including a ferroelectric capacitor;
- a plurality of wordlines;
- a plurality of platelines; and
- a plurality of wordline driver circuits, wherein a K-th wordline driver circuit among the plurality of wordline driver circuits includes:
a driver which drives a K-th wordline;
a transfer transistor provided between the driver and the K-th wordline; and
a gate control circuit which performs gate control of the transfer transistor, and
wherein the gate control circuit performs gate control which causes the transfer transistor to be turned on, and performs gate control which causes the transfer transistor to be turned off to set the K-th wordline in a high impedance state, before a voltage of the K-th wordline is boosted after the transfer transistor has been turned on and the K-th wordline has been driven by the driver.

A second aspect of the invention relates to a ferroelectric memory comprising:
a memory cell array in which a plurality of memory cells are disposed, each of the memory cells including a ferroelectric capacitor;
a plurality of wordlines;
a plurality of platelines; and
a plurality of wordline driver circuits,
wherein a K-th wordline driver circuit among the plurality of wordline driver circuits includes:
a driver which drives a K-th wordline;
a transfer transistor provided between the driver and the K-th wordline; and
a gate control circuit which performs gate control of the transfer transistor, and
wherein the gate control circuit performs gate control which causes the transfer transistor to be turned on, and performs gate control which causes the transfer transistor to be turned off before a K-th plateline corresponding to the K-th wordline is driven after the transfer transistor has been turned on and the K-th wordline has been driven by the driver; and
wherein the driver drives the K-th plateline corresponding to the K-th wordline after the transfer transistor has been turned off.

A third aspect of the invention relates to a ferroelectric memory comprising:
a memory cell array in which a plurality of memory cells are disposed, each of the memory cells including a ferroelectric capacitor;
a plurality of wordlines;
a plurality of platelines; and
a plurality of plateline driver circuits,
wherein a K-th plateline driver circuit among the plurality of plateline driver circuits includes:
a transfer transistor provided between a drive node driven by a given driver and a K-th plateline; and
a gate control circuit which performs gate control of the transfer transistor,
wherein the gate control circuit includes:
a voltage setting circuit which sets a gate node of the transfer transistor at a first voltage level when a first plateline control signal has become active; and
a gate control capacitor to which a second plateline control signal is supplied at one end and with which the gate node is connected at the other end, and
wherein the gate control capacitor sets the gate node at a second voltage level by capacitive coupling when the second plateline control signal has become active after the gate node has been set at the first voltage level.

A fourth aspect of the invention relates to a method of driving a ferroelectric memory which includes a memory cell array in which a plurality of memory cells are disposed, a plurality of wordlines, and a plurality of platelines, each of the memory cells including a ferroelectric capacitor, the method comprising:
performing gate control which causes a transfer transistor to be turned on, the transfer transistor being provided between a K-th wordline and a driver which drives the K-th wordline; and
performing gate control which causes the transfer transistor to be turned off to set the K-th wordline in a high impedance state, before a voltage of the K-th wordline is boosted after the transfer transistor has been turned on and the K-th wordline has been driven by the driver.

A fifth aspect of the invention relates to a method of driving a ferroelectric memory which includes a memory cell array in which a plurality of memory cells are disposed, a plurality of wordlines, and a plurality of platelines, each of the memory cells including a ferroelectric capacitor, the method comprising:
performing gate control which causes a transfer transistor to be turned on, the transfer transistor being provided between a K-th wordline and a driver which drives the K-th wordline;
performing gate control which causes the transfer transistor to be turned off before a K-th plateline corresponding to the K-th wordline is driven after the transfer transistor has been turned on and the K-th wordline has been driven by the driver; and
driving the K-th plateline corresponding to the K-th wordline by using the driver after the transfer transistor has been turned off.

BRIEF DESCRIPTION OF THE SEVERAL VIEWS OF THE DRAWING

FIGS. 1A to 1C show an example of a memory cell of a ferroelectric memory.

FIG. 11 is a fourth modification of the WL driver circuit and the PL driver circuit shown in FIG. 6.

DETAILED DESCRIPTION OF THE EMBODIMENT

Figure 2A:
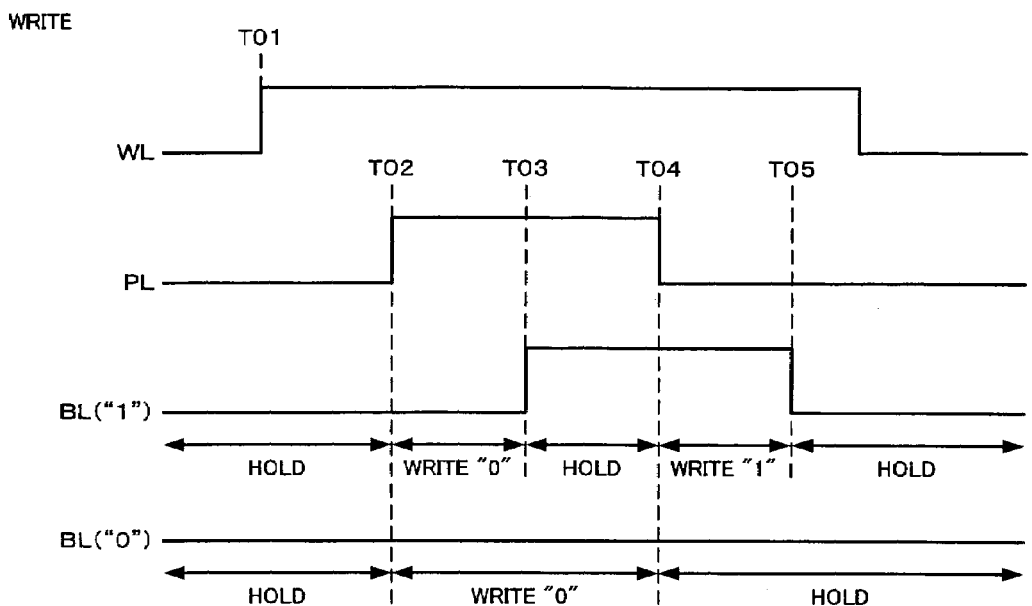
FIGS. 2A and 2B are illustrative of a write operation and a read operation of a ferroelectric memory.

The invention may provide a ferroelectric memory and a method of driving the same capable of efficiently driving a wordline and a plateline using a small circuit configuration.

A ferroelectric memory according to one embodiment of the invention, comprises:

a memory cell array in which a plurality of memory cells are disposed, each of the memory cells including a ferroelectric capacitor;

a plurality of wordlines;

a plurality of platelines; and a plurality of wordline driver circuits, wherein a K-th wordline driver circuit among the plurality of wordline driver circuits includes:

a driver which drives a K-th wordline;

a transfer transistor provided between the driver and the K-th wordline; and a gate control circuit which performs gate control of the transfer transistor, and wherein the gate control circuit performs gate control which causes the transfer transistor to be turned on, and performs gate control which causes the transfer transistor to be turned off to set the K-th wordline in a high impedance state, before a voltage of the K-th wordline is boosted after the transfer transistor has been turned on and the K-th wordline has been driven by the driver.

According to the embodiment, the transfer transistor is turned off before the voltage of the K-th wordline (K is an arbitrary integer) is boosted after the transfer transistor has been turned on. This causes the K-th wordline to be set in a high impedance state, whereby the boost operation of the wordline is facilitated. Moreover, a leakage current which flows from the K-th wordline to the driver through the transfer transistor can be reduced.

With this embodiment, the gate control circuit may perform gate control which causes the transfer transistor to be turned on when the K-th wordline has been selected by an address decode signal and a first wordline control signal has become active, and may perform gate control which causes the transfer transistor to be turned off when the first wordline control signal has become inactive.

According to this feature, the on/off timing of the transfer transistor can be arbitrarily controlled by controlling the timing of the first wordline control signal.

With this embodiment, the K-th wordline driver circuit may include a wordline voltage booster circuit, and the wordline voltage booster circuit may boost the voltage of the K-th wordline when a second wordline control signal has become active.

According to this feature, the on/off timing of the transfer transistor and the boost timing of the wordline can be independently controlled.

With this embodiment, the wordline voltage booster circuit may include a boost capacitor to which the second wordline control signal is supplied at one end and with which the K-th wordline is connected at the other end.

According to this feature, the voltage of the wordline set in a high impedance state can be boosted by capacitive coupling of the boost capacitor, whereby the boost operation can be realized at low power consumption.

With this embodiment, the boost capacitor may be used in common among the wordline driver circuits.

According to this feature, the circuit scale can be further reduced.

With this embodiment, the driver may drive a K-th plateline corresponding to the K-th wordline after the transfer transistor has been turned off.

According to this feature, the driver can be used to drive both the wordline and the plateline, whereby the circuit scale can be reduced.

A ferroelectric memory according to another embodiment of the invention comprises:

a memory cell array in which a plurality of memory cells are disposed, each of the memory cells including a ferroelectric capacitor;

a plurality of wordlines;

a plurality of platelines; and a plurality of wordline driver circuits, wherein a K-th wordline driver circuit among the plurality of wordline driver circuits includes:

a driver which drives a K-th wordline;

a transfer transistor provided between the driver and the K-th wordline; and a gate control circuit which performs gate control of the transfer transistor, and wherein the gate control circuit performs gate control which causes the transfer transistor to be turned on, and performs gate control which causes the transfer transistor to be turned off before a K-th plateline corresponding to the K-th wordline is driven after the transfer transistor has been turned on and the K-th wordline has been driven by the driver; and wherein the driver drives the K-th plateline corresponding to the K-th wordline after the transfer transistor has been turned off.

According to the embodiment, the transfer transistor is turned off before the voltage of the K-th plateline (K is an arbitrary integer) is driven after the transfer transistor has been turned on. This makes it unnecessary for the driver to drive the K-th wordline, so that the driver can be used to drive the K-th plateline, for example.

With this embodiment, the gate control circuit may perform gate control which causes the transfer transistor to be turned on when the K-th wordline has been selected by an address decode signal and a first wordline control signal has become active, and may perform gate control which causes the transfer transistor to be turned off when the first wordline control signal has become inactive.

According to this feature, the on/off timing of the transfer transistor can be arbitrarily controlled by controlling the timing of the first wordline control signal.

With this embodiment, the gate control circuit may include:

a voltage setting circuit which sets a gate node of the transfer transistor at a first voltage level when an address decode signal has become active and the K-th wordline has been selected; and a gate control capacitor to which a first wordline control signal is supplied at one end and with which the gate node is connected at the other end, and the gate control capacitor may set the gate node at a second voltage level by capacitive coupling when the first wordline control signal has become active after the gate node has been set at the first voltage level, and may set the gate node at a third voltage level, which causes the transfer transistor to be turned off, by capacitive coupling when the first wordline control signal has become inactive after the gate node has been set at the second voltage level.

According to this feature, the voltage level of the gate node of the transfer transistor can be set at low power consumption using a small-scale circuit. Moreover, a leakage current which flows from the K-th wordline to the driver can be reduced by setting the gate node at the third voltage level to cause the transfer transistor to be turned off.

With this embodiment, the gate control capacitor may be used in common among the wordline driver circuits.

According to this feature, the circuit scale can be further reduced.

With this embodiment, the voltage setting circuit may include a clamp circuit which clamps a voltage of the gate node so that the voltage of the gate node does not become higher than a given voltage level.

According to this feature, damage to the gate oxide film of the transfer transistor or the like can be reduced, whereby reliability can be improved.

A ferroelectric memory according to a further embodiment of the invention comprises:

a memory cell array in which a plurality of memory cells are disposed, each of the memory cells including a ferroelectric capacitor;

a plurality of wordlines;

a plurality of platelines; and a plurality of plateline driver circuits, wherein a K-th plateline driver circuit among the plurality of plateline driver circuits includes:

a transfer transistor provided between a drive node driven by a given driver and a K-th plateline; and a gate control circuit which performs gate control of the transfer transistor, wherein the gate control circuit includes:

a voltage setting circuit which sets a gate node of the transfer transistor at a first voltage level when a first plateline control signal has become active; and a gate control capacitor to which a second plateline control signal is supplied at one end and with which the gate node is connected at the other end, and wherein the gate control capacitor sets the gate node at a second voltage level by capacitive coupling when the second plateline control signal has become active after the gate node has been set at the first voltage level.

According to the embodiment, the K-th plateline can be driven by controlling the voltage level of the gate node of the transfer transistor at low power consumption using a small-scale circuit.

With this embodiment, a driver of a K-th wordline driver circuit which drives a K-th wordline corresponding to the K-th plateline may drive the K-th plateline through the drive node and the transfer transistor.

According to this feature, since the K-th plateline can be driven by effectively utilizing the driver of the K-th wordline driver circuit, the circuit scale can be reduced.

With this embodiment, the voltage setting circuit and the gate control capacitor may be used in common among the plateline driver circuits.

According to this feature, the circuit scale can be further reduced.

A still further embodiment of the invention provides a method of driving a ferroelectric memory which includes a memory cell array in which a plurality of memory cells are disposed, a plurality of wordlines, and a plurality of platelines, each of the memory cells including a ferroelectric capacitor, the method comprising:

performing gate control which causes a transfer transistor to be turned on, the transfer transistor being provided between a K-th wordline and a driver which drives the K-th wordline; and performing gate control which causes the transfer transistor to be turned off to set the K-th wordline in a high impedance state, before a voltage of the K-th wordline is boosted after the transfer transistor has been turned on and the K-th wordline has been driven by the driver.

A yet further embodiment of the invention provides a method of driving a ferroelectric memory which includes a memory cell array in which a plurality of memory cells are disposed, a plurality of wordlines, and a plurality of platelines, each of the memory cells including a ferroelectric capacitor, the method comprising:

performing gate control which causes a transfer transistor to be turned on, the transfer transistor being provided between a K-th wordline and a driver which drives the K-th wordline;

performing gate control which causes the transfer transistor to be turned off before a K-th plateline corresponding to the K-th wordline is driven after the transfer transistor has been turned on and the K-th wordline has been driven by the driver; and driving the K-th plateline corresponding to the K-th wordline by using the driver after the transfer transistor has been turned off.

Note that the embodiments described hereunder do not in any way limit the scope of the invention defined by the claims laid out herein. Note also that not all of the elements of these embodiments should be taken as essential requirements to the means of the present invention.

1. Ferroelectric Memory

FIG. 1A shows an example of a memory cell of a ferroelectric memory. The memory cell includes a ferroelectric capacitor CS and an N-type (first conductivity type in a broad sense) transfer transistor TR. A node NC is connected with one end of the ferroelectric capacitor CS, and a plateline PL is connected with the other end of the ferroelectric capacitor CS. A wordline WL is connected with a gate of the transfer transistor TR, a bitline BL is connected with a source of the transfer transistor TR, and the node NC is connected with a drain of the transfer transistor TR. In the specification, one side of a current path of a transistor is called a drain, and the other side is called a source for convenience. The memory cell is not limited to the configuration shown in FIG. 1A. For example, the memory cell may be a 2T2C (two-transistor two-capacitor) type, an FET type, or the like instead of the 1T1C (one-transistor one-capacitor) type as shown in FIG. 1A.

When writing the logical "1" into the memory cell, a select voltage is applied to the wordline WL, a voltage of VCC (second power supply in a broad sense) is applied to the bitline BL, and 0 V (voltage of first power supply in a broad sense) is applied to the plateline PL, as shown in FIG. 1B. This causes the remanent polarization of the ferroelectric capacitor CS to become "negative" as indicated by A1 of hysteresis characteristics shown in FIG. 1C. The state in which the remanent polarization is "negative" may be defined as a state in which the logical "1" is stored, for example.

When writing the logical "0" into the memory cell, the select voltage is applied to the wordline WL, 0 V is applied to the bitline BL, and the voltage VCC (e.g. 5 V) is applied to the plateline PL. This causes the remanent polarization of the ferroelectric capacitor CS to become "positive" as indicated by A2 of the hysteresis characteristics shown in FIG. 1C. The state in which the remanent polarization is "positive" may be defined as a state in which the logical "0" is stored, for example.

In FIG. 1A, the transfer transistor TR has a threshold value (VTH). Therefore, when applying the voltage VCC to the bitline BL and applying the voltage VCC to the wordline WL, the node NC is set at a voltage (VCC−VTH) lower than the voltage VCC. As a result, a sufficient voltage cannot be applied the ferroelectric capacitor CS, whereby a problem such as a write failure or an imprint occurs. Therefore, it is desirable to apply a voltage (VPP) higher than the voltage VCC to the wordline WL as the select voltage. As is clear from FIG. 1B, a phenomenon in which the voltage of the node NC is decreased due to the threshold voltage occurs only when writing the logical "1" into the memory cell by applying the voltage VCC to the bitline BL.

FIG. 2A shows a signal waveform example during the write operation into the memory cell. As shown in FIG. 2A, when writing the logical "1" into the memory cell, the logical "0" is written in a period from T02 to T03, and the logical "1" is written in a period from T04 to T05. When writing the logical "0" into the memory cell, the logical "0" is written in a period from T02 to T04.

Figure 2B:
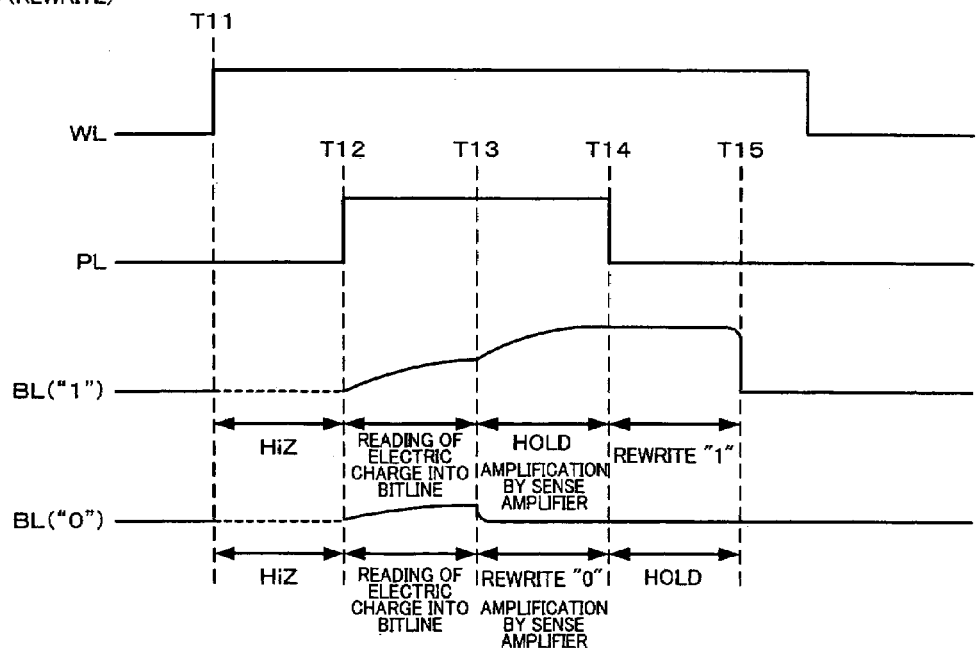

FIG. 2B shows a signal waveform example during the read operation from the memory cell. As shown in FIG. 2B, the bitline is set in a high impedance state (HiZ) in a period from T11 to T12, and an electric charge is transferred from the ferroelectric capacitor to the bitline in a period from T12 to T13. The bitline voltage is amplified by a sense amplifier in a period from T13 to T14. When data at the logical "1" has been read from the memory cell, the logical "1" is rewritten in a period from T14 to T15 in order to restore the data destroyed by the read operation. When data at the logical "0" has been read from the memory cell, the bitline voltage is amplified by the sense amplifier and the logical "0" is rewritten in the period from T13 to T14.

As indicated by the period from T04 to T05 and the period from T14 to T15 shown in FIGS. 2A and 2B, the logical "1" is written after the plateline PL has fallen to 0 V (inactive). Therefore, it is necessary to continuously apply the select voltage to the wordline WL for a given period after the plateline PL has fallen to 0 V. In this case, if the select voltage of the wordline WL is not set at a high voltage, the voltage of the node NC is decreased due to the threshold voltage of the transfer transistor TR, as described with reference to FIG. 1A. Therefore, it is desirable to set the select voltage of the wordline WL at a high voltage (VPP) at least in the period from T04 to T05 and the period from T14 to T15.

2. Entire Configuration

Figure 3:
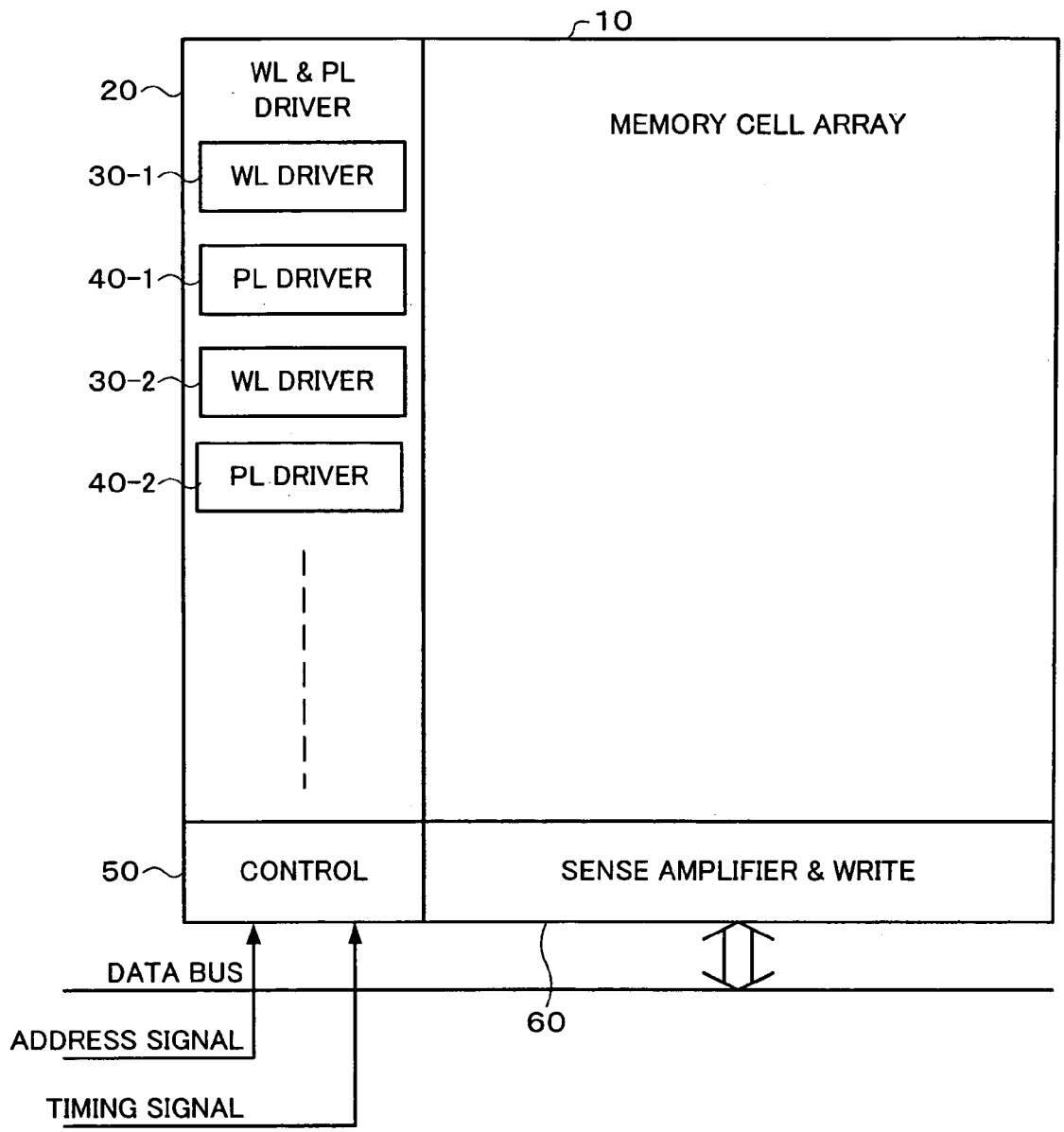
FIG. 3 shows a ferroelectric memory according to one embodiment of the invention.

FIG. 3 shows a ferroelectric memory (semiconductor memory device) according to one embodiment of the invention. The ferroelectric memory according to the embodiment is not limited to the configuration shown in FIG. 3, and may be configured to exclude some of the constituent elements or include other constituent elements.

The ferroelectric memory according to the embodiment includes a memory cell array 10. A plurality of memory cells including a ferroelectric capacitor are disposed in the memory cell array 10. In more detail, each memory cell includes a ferroelectric capacitor and a transfer transistor connected with one end of the ferroelectric capacitor, as shown in FIG. 1A. In the case of a 2T2C type memory cell, the memory cell includes a first ferroelectric capacitor which stores one of a logical "0" and a logical "1", a first transfer transistor connected with one end of the first ferroelectric capacitor, a second ferroelectric capacitor which stores the other of the logical "0" and the logical "1", and a second transfer transistor connected with one end of the second ferroelectric capacitor. An array of reference cells (dummy memory cells) for generating a reference voltage for the sense amplifier may be provided in addition to the memory cell array.

The ferroelectric memory includes a plurality of wordlines, a plurality of platelines, and a plurality of bitlines (not shown) ("wordline", "plateline", and "bitline" are appropriately abbreviated as "WL", "PL", and "BL", respectively). The wordline (K-th wordline) is connected with a gate of the transfer transistor of the memory cell. The bitline is connected with one end of the ferroelectric capacitor through a source and a drain of the transfer transistor. The plateline (K-th plateline) is connected with the other end of the ferroelectric capacitor.

The ferroelectric memory includes a WL & PL driver section 20 (driver section in a broad sense). The WL & PL driver section 20 decodes address signals and drives the wordline and the plateline. The WL & PL driver section 20 includes a plurality of WL driver circuits 30-1, 30-2, . . . , and a plurality of PL driver circuits 40-1, 40-2, . . . . The WL driver circuit 30 (30-1, 30-2, . . . ) drives the wordline (K-th wordline), and the PL driver circuit 40 (40-1, 40-2, . . . ) drives the plateline (K-th plateline).

The ferroelectric memory includes a control circuit 50. The control circuit 50 receives address signals (X address signal and Y address signal) and various timing signals (e.g. WL timing signal and PL timing signal), generates various control signals (e.g. WL control signal and PL control signal), and supplies the control signals to the WL & PL driver section 20, a sense amplifier & write section 60, and the like.

The sense amplifier & write section 60 performs a data read operation, a data write (rewrite) operation, and the like by controlling the bitline. In more detail, the sense amplifier & write section 60 determines whether data read from the memory cell is at the logical "1" or "0" during the data read operation by amplifying the voltage of the bitline using a sense amplifier and comparing the amplified voltage with the reference voltage. When writing data from a data bus into the memory cell, the sense amplifier & write section 60 writes the logical "1" or "0" into the memory cell by setting the voltage of the bitline at the voltage VCC or 0 V.

Figure 4:
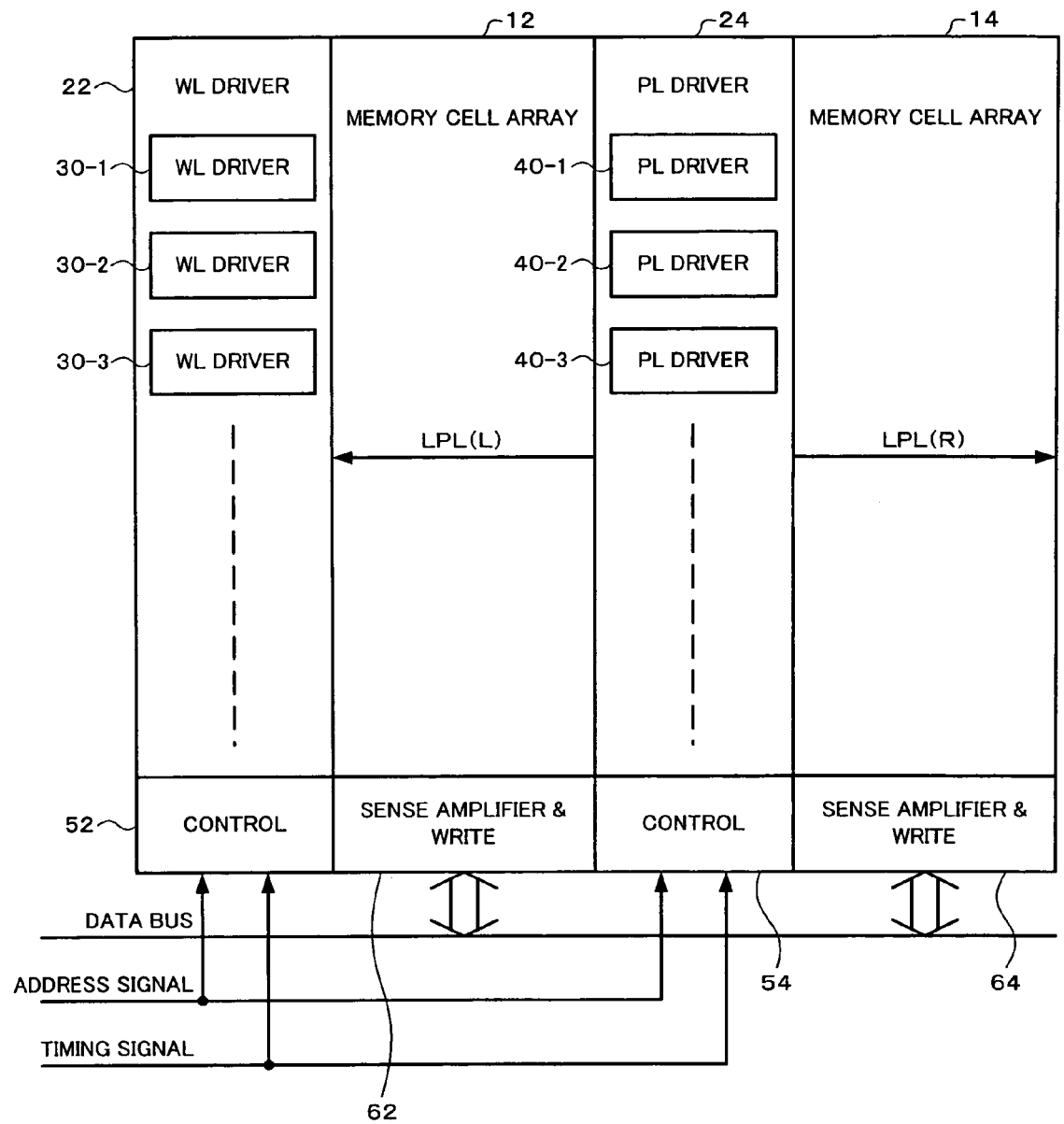
FIG. 4 shows a ferroelectric memory according to another embodiment of the invention.

The ferroelectric memory is not limited to the configuration shown in FIG. 3. Various modifications and variations may be made. For example, the ferroelectric memory may be configured as shown in FIG. 4. In FIG. 4, the memory cell array is divided into two blocks (a plurality of blocks in a broad sense), such as memory cell arrays 12 and 14. A WL driver section 22 including a plurality of WL driver circuits 30-1, 30-2, 30-3, . . . , and a PL driver section 24 including a plurality of PL driver circuits 40-1, 40-2, 40-3, . . . are separately provided. For example, the WL driver section 22 provided on the left drives the wordline, and the PL driver section 24 which has received the signal from the wordline drives the plateline (local plateline LPL(L)) of the left memory cell array 12 and the plateline (local plateline LPL(R)) of the right memory cell array 14. Control circuits 52 and 54 generate various control signals or the like for the WL driver section 22 and the PL driver section 24, respectively. Sense amplifier & write sections 62 and 64 perform the data read and write (rewrite) operation for the memory cell arrays 12 and 14, respectively.

In FIG. 4, the memory cell array is divided into two blocks. However, the memory cell array may be divided into three or more blocks. The WL driver section 22 may be disposed on either the left or right side, and the PL driver section 24 may be disposed on the other side.

3. Comparative Example

Figure 5:
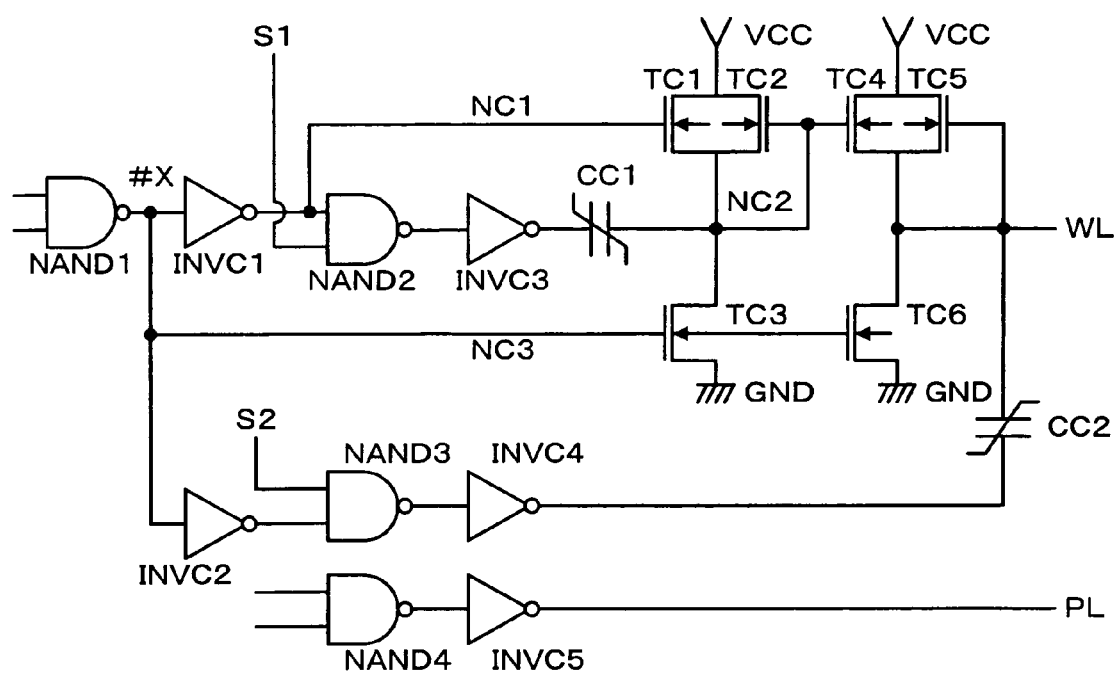
FIG. 5 shows a comparative example.

FIG. 5 shows an example of a WL driver circuit and a PL driver circuit as a comparative example of the embodiment. When an address decode signal #X is inactive (VCC), transistors TC3 and TC6 are turned on so that a node NC2 and a wordline WL are set at 0 V. The symbol "#" indicates negative logic.

When the address decode signal #X has become active (0 V), a transistor TC1 is turned on and the transistors TC3 and TC6 are turned off. As a result, the voltage of the node NC2 is boosted so that a transistor TC4 is set in a weak on state, whereby the voltage of the wordline WL is boosted.

When a pulse signal S1 is applied, the voltage of the node NC2 is boosted by capacitive coupling of a capacitor CC1 so that the transistor TC4 is set in a strong on state, whereby the voltage of the wordline WL is boosted up to the voltage VCC. The transistor TC4 is then turned off. When a pulse signal S2 is applied, the voltage of the wordline WL is boosted by capacitive coupling of a capacitor CC2.

In the comparative example shown in FIG. 5, since many logic circuits (e.g. NAND1 to NAND4 and INVC1 to INVC5) are necessary, the WL driver circuit and the PL driver circuit are increased in scale and become complicated. Since the number of WL driver circuits and PL driver circuits is large, the scale of the ferroelectric memory is increased and a reduction in power consumption is hindered. The comparative example shown in FIG. 5 also has a problem in which it is difficult to use the driver which drives the wordline WL in common as the driver which drives the plateline PL.

4. WL Driver Circuit and PL Driver Circuit

Figure 6:
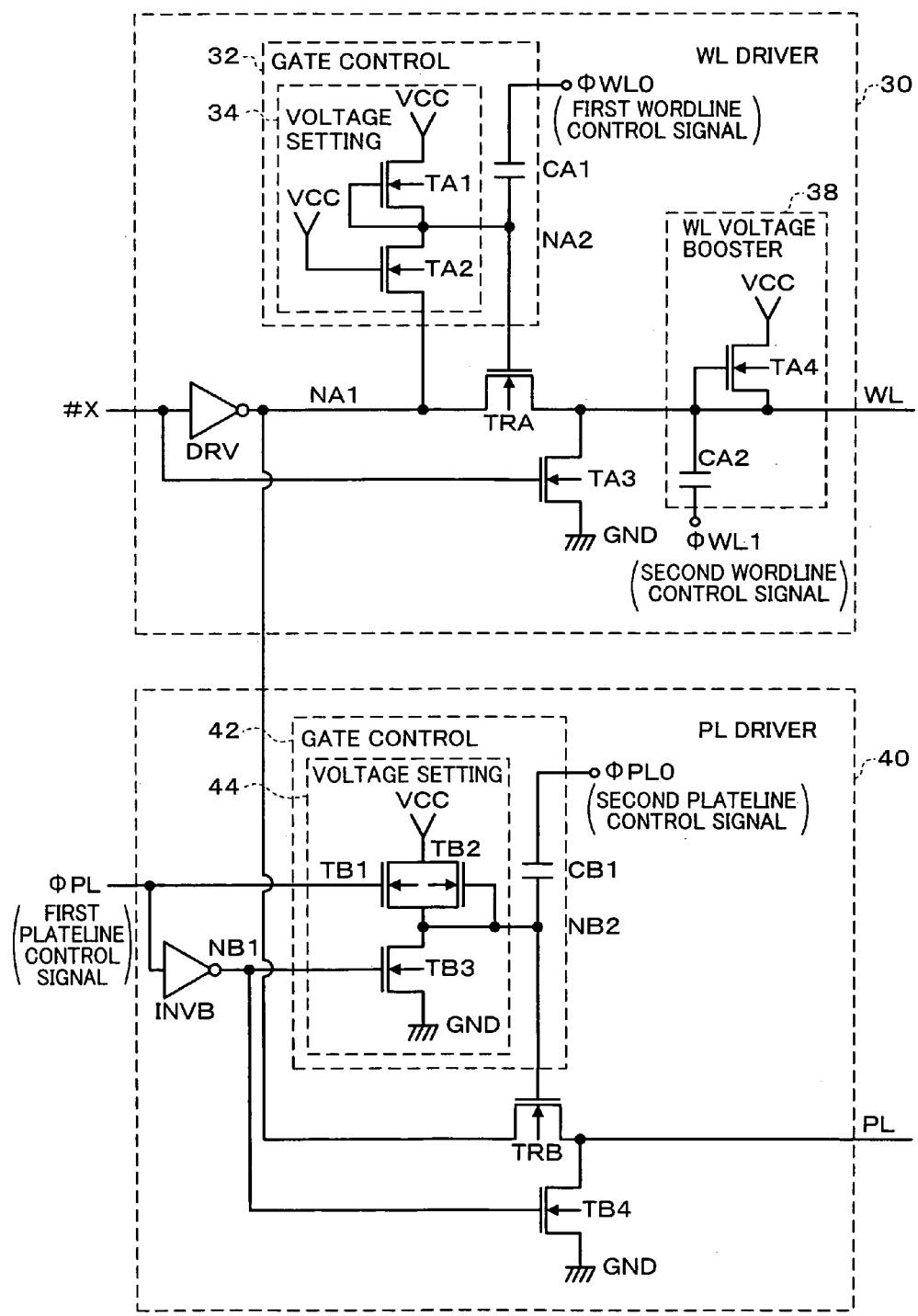
FIG. 6 shows a WL driver circuit and a PL driver circuit according to one embodiment of the invention.
Figure 7:
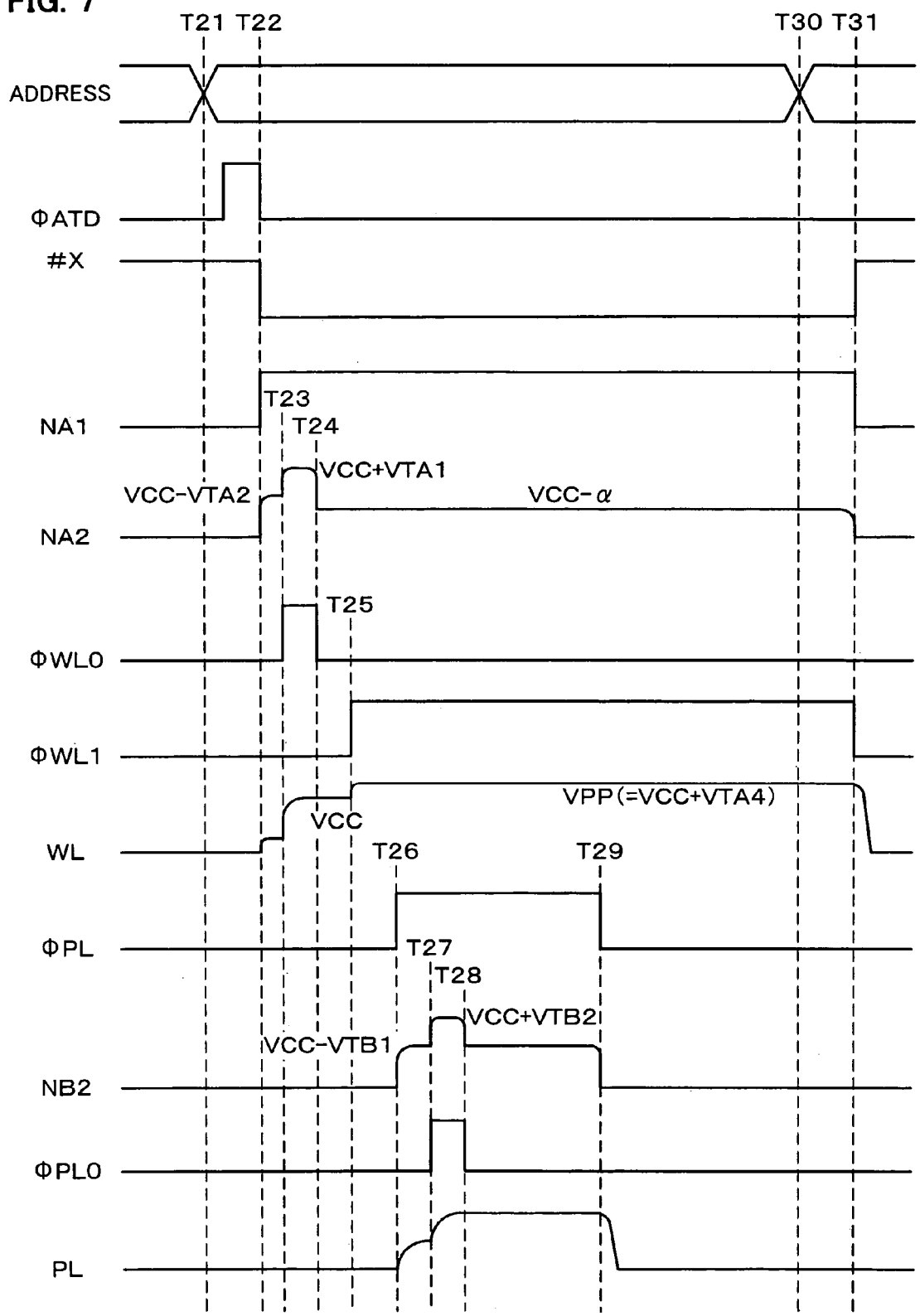
FIG. 7 is an example of a signal waveform diagram illustrative of the operation of the WL driver circuit and the PL driver circuit shown in FIG. 6.

FIG. 6 shows a WL driver circuit 30 and a PL driver circuit 40 according to one embodiment of the invention which can solve the above-described problems, and FIG. 7 shows a signal waveform example illustrative of the operation of the WL driver circuit 30 and the PL driver circuit 40. The WL driver circuit and the PL driver circuit according to the embodiment are not limited to the configuration shown in FIG. 6, and may be configured to exclude some of the constituent elements or include other constituent elements.

As shown in FIG. 6, the WL driver circuit 30 (K-th WL driver circuit) includes a driver DRV, a transfer transistor TRA, and a gate control circuit 32. The WL driver circuit 30 also includes a WL voltage booster circuit 38 and an N-type transistor TA3.

A feature of the embodiment is that the transfer transistor TRA is on/off-controlled by using the gate control circuit 32 so that the driver DRV can be arbitrarily disconnected from the wordline WL. The voltage of the wordline WL can be easily boosted by using the WL voltage booster circuit 38 by disconnecting the driver DRV from the wordline WL by causing the transfer transistor TRA to be turned off. Moreover, the driver DRV can be used not only to drive the wordline WL, but also to drive the plateline PL by disconnecting the driver DRV from the wordline WL and causing a transfer transistor TRB of the PL driver circuit 40 to be turned on.

The details of each circuit shown in FIG. 6 are described below. The driver DRV is a circuit which drives the wordline WL (K-th wordline: K is an integer of $1 \leq K \leq N$). Specifically, the driver DRV receives an address decode signal #X (X address decode signal), and outputs an inverted signal (drive voltage) of the address decode signal #X to a drive node NA1. The symbol "#" indicates negative logic.

When the address decode signal #X is inactive (VCC), the N-type (first conductivity type in a broad sense) transistor TA3 is turned on so that the wordline WL is discharged to 0 V (voltage level of first power supply in a broad sense). When the address decode signal #X has been set at 0 V at a timing T22 shown in FIG. 7 and the wordline WL has been selected, the drive node NA1 is set at a voltage level VCC (voltage level of second power supply in a broad sense). In FIG. 7, ΦATD indicates an address transition detection signal. In FIG. 6, the driver DRV is an inverter circuit which outputs an inverted signal of the input signal. However, the driver DRV is not limited thereto. Various modifications and variations may be made. For example, the driver DRV may be a buffer circuit which outputs a non-inverted signal of the input signal. In this case, a positive-logic address decode signal X may be input to the driver DRV.

The transfer transistor TRA (switching element) is an N-type (first conductivity type) transistor provided between the driver DRV and the wordline WL (K-th wordline). A gate of the transfer transistor TRA is controlled by the gate control circuit 32, and the transfer transistor TRA on/off-controls connection between the drive node NA1 (output node of the driver DRV) and the wordline WL. In FIG. 6, the transfer transistor TRA is formed by one N-type transistor. However, the configuration of the transfer transistor TRA is not limited thereto. Various modifications and variations may be made.

The gate control circuit 32 (switching control circuit) is a circuit which controls the gate of the transfer transistor TRA. In more detail, when the address decode signal #X has become active (0 V) at a timing T22 shown in FIG. 7 and a first wordline control signal ΦWL0 has become active (VCC) at a timing T23, the gate control circuit 32 causes the transfer transistor TRA to be turned on (strong on).

The gate control circuit 32 causes the transfer transistor TRA to be turned off before the voltage of the wordline WL is boosted after the transfer transistor TRA has been turned on and the wordline WL has been driven by the driver DRV. Specifically, the gate control circuit 32 causes the transfer transistor TRA to be turned off before the voltage of the wordline WL is boosted at a timing T25 after the transfer transistor TRA has been turned on at the timing T23 shown in FIG. 7. In other words, the gate control circuit 32 causes the transfer transistor TRA to be turned off when the wordline control signal ΦWL0 has become inactive (0 V). When the transfer transistor TRA is turned off, the wordline WL is set in a high impedance state. This facilitates the boost operation (timings T25 to T31) of the wordline WL using the WL voltage booster circuit 38 and the like.

The gate control circuit 32 causes the transfer transistor TRA to be turned off before the plateline PL (K-th plateline) corresponding to the wordline WL (K-th wordline) is driven after the transfer transistor TRA has been turned on and the wordline WL has been driven by the driver DRV. Specifically, the gate control circuit 32 causes the transfer transistor TRA to be turned off at the timing T24 before the plateline PL is driven by the driver DRV at the timing T26 after the transfer transistor TRA has been turned on at the timing T23 shown in FIG. 7. The driver DRV can drive the plateline PL corresponding to the wordline WL by causing the transfer transistor TRA to be turned off. Specifically, the driver DRV can be used to drive both the wordline WL and the plateline PL. The plateline PL corresponding to the wordline WL refers to a plateline which should be driven (pulse-driven) when the wordline WL is selected.

The gate control circuit 32 includes a voltage setting circuit 34 and a gate control capacitor CA1. When the address decode signal #X has become active (0 V) at the timing T22 shown in FIG. 7 so that the wordline WL has been selected, the voltage setting circuit 34 sets a gate node NA2 of the transfer transistor TRA at a first voltage level "VCC−VTA2" (VTA2 is the threshold voltage of a transistor TA2).

In more detail, the voltage setting circuit 34 includes an N-type transistor TA1 to which the voltage VCC (voltage of second power supply) is supplied at a drain and with which the gate node NA2 is connected at a gate and a source. The voltage setting circuit 34 includes an N-type transistor TA2 with which the gate node NA2 is connected at a drain, to which the voltage VCC is supplied at a gate, and with which the drive node NA1 is connected at a source.

The transistor TA1 functions as a circuit which clamps the voltage of the gate node NA2 so that the voltage of the gate node NA2 does not become higher than a given voltage level "VCC+VTA1" (VTA1 is the threshold voltage of the transistor TA1). The clamp circuit for the gate node NA2 is not limited to the configuration of the transistor TA1 as shown in FIG. 6, and may be realized by various elements such as a diode element or various circuits.

The wordline control signal ΦWL0 is supplied to one end of the gate control capacitor CA1, and the gate node NA2 is connected with the other end of the gate control capacitor CA1. When the wordline control signal ΦWL0 has become active (VCC) after the gate node NA2 has been set at the first voltage level "VCC−VTA2", the capacitor CA1 sets the gate node NA2 at a second voltage level "VCC+VTA1" by capacitive coupling. Specifically, when the wordline control signal ΦWL0 has become active at the timing T23 after the gate node NA2 has been set at the first voltage level "VCC−VTA2" by the voltage setting circuit 34 at the timing T22 shown in FIG. 7, the gate node NA2 is set (clamped) at the second voltage level "VCC+VTA1" by capacitive coupling of the capacitor CA1.

When a wordline control signal ΦWL1 has become inactive (0 V) after the gate node NA2 has been set at the second voltage level "VCC+VTA1", the gate control capacitor CA1 sets the gate node NA2 at a third voltage level "VCC−α" (α>VTA, VTA is the threshold voltage of the transfer transistor TRA), which causes the transfer transistor TRA to be turned off, by capacitive coupling. Specifically, when the wordline control signal ΦWL0 has become inactive at the timing T24 after the gate node NA2 has been set at the second voltage level "VCC+VTA1" at the timing T23 shown in FIG. 7, the gate node NA2 is set at the third voltage level "VCC−α" by capacitive coupling of the capacitor CA1, whereby the transfer transistor TRA is turned off. The capacitor CA1 may be either a paraelectric capacitor or a ferroelectric capacitor.

The WL voltage booster circuit 38 is a circuit which performs the boost operation of the wordline WL, and boosts the voltage of the wordline (K-th wordline) when the second wordline control signal ΦWL1 has become active (VCC). The WL voltage booster circuit 38 includes a boost capacitor CA2 to which the wordline control signal ΦWL1 is supplied at one end and with which the wordline WL is connected at the other end. When the wordline control signal ΦWL1 has become active at the timing T25 after the transfer transistor TRA has been turned off at the timing T24 shown in FIG. 7 and the wordline has been set in a high impedance state, the voltage of the wordline WL is boosted up to the voltage VPP by capacitive coupling of the capacitor CA2 (T25 to T31).

The WL voltage booster circuit 38 includes an N-type transistor TA4 to which the voltage VCC (voltage of second power supply) is supplied at a drain and with which the wordline WL is connected at a gate and a source. The transistor TA4 functions as a circuit which clamps the voltage of the wordline WL so that the voltage of the wordline WL does not become higher than a given voltage level "VPP=VCC+VTA4" (VTA4 is the threshold voltage of the transistor TA4). The clamp circuit for the wordline WL is not limited to the configuration of the transistor TA4 as shown in FIG. 6, and may be realized by various elements such as a diode element or various circuits.

The PL driver circuit 40 (K-th PL driver circuit) is described below. As shown in FIG. 6, the PL driver circuit 40 includes a transfer transistor TRB and a gate control circuit 42. The PL driver circuit 40 also includes a transistor TB4 and an inverter circuit INVB which outputs an inverted signal of a first plateline control signal ΦPL.

The N-type transistor TB4 is turned on when the plateline control signal ΦPL has become inactive (0 V) to set the plateline PL at 0 V.

The transfer transistor TRB (switching element) is an N-type transistor provided between the drive node NA1 and the plateline PL (K-th plateline). A gate of the transfer transistor TRB is controlled by the gate control circuit 42, and the transfer transistor TRB on/off-controls connection between the drive node NA1 (output node of the driver DRV) and the plateline PL. In FIG. 6, the transfer transistor TRB is formed by one N-type transistor. However, the transfer transistor TRB is not limited thereto. Various modifications and variations may be made.

The gate control circuit 42 (switching control circuit) is a circuit which controls the gate of the transfer transistor TRB. The gate control circuit 42 includes a voltage setting circuit 44 and a gate control capacitor CB1.

When the plateline control signal ΦPL has become active (VCC) at the timing T26 shown in FIG. 7, the voltage setting circuit 44 sets a gate node NB2 of the transfer transistor TRB at a first voltage level "VCC−VTB1" (VTB1 is the threshold voltage of a transistor TB1).

In more detail, the voltage setting circuit 44 includes an N-type transistor TB1 to which the voltage VCC is supplied at a drain, to which the plateline control signal ΦPL is supplied at a gate, and with which the gate node NB2 is connected at a source, and an N-type transistor TB2 to which the voltage VCC is supplied at a drain and with which the gate node NB2 is connected at a gate and a source. The voltage setting circuit 44 also includes an N-type transistor TB3 with which the gate node NB2 is connected at a drain, with which a node NB1 (inverted signal of the plateline control signal ΦPL) is connected at a gate, and to which 0 V (GND) is supplied at a source.

The transistor TB2 functions as a circuit which clamps the voltage of the gate node NB2 so that the voltage of the gate node NB2 does not become higher than a given voltage level "VCC+VTB2" (VTB2 is the threshold voltage of the transistor TB2). The clamp circuit for the gate node NB2 is not limited to the configuration of the transistor TB2 as shown in FIG. 6, and may be realized by various elements such as a diode element or various circuits.

A second plateline control signal ΦPL0 is supplied to one end of the gate control capacitor CB1, and the gate node NAB2 is connected with the other end of the gate control capacitor CB1. When the plateline control signal ΦPL0 has become active (VCC) after the gate node NB2 has been set at the first voltage level "VCC−VTB1", the capacitor CB1 sets the gate node NB2 at a second voltage level "VCC+VTB2" by capacitive coupling. Specifically, when the plateline control signal ΦPL0 has become active at the timing T27 after the gate node NB2 has been set at the first voltage level "VCC−VTB1" by the voltage setting circuit 44 at the timing T26 shown in FIG. 7, the gate node NB2 is set (clamped) at the second voltage level "VCC+VTB2" by capacitive coupling of the capacitor CB1. The capacitor CB1 may be either a paraelectric capacitor or a ferroelectric capacitor.

When the gate node NB2 has been set at the second voltage level "VCC+VTB2", the transfer transistor TRB is completely turned on. The driver DRV of the WL driver circuit 30 (K-th WL driver circuit) drives the plateline PL through the transfer transistor TRB (drive node NA1) which has been turned on.

Figure 8:
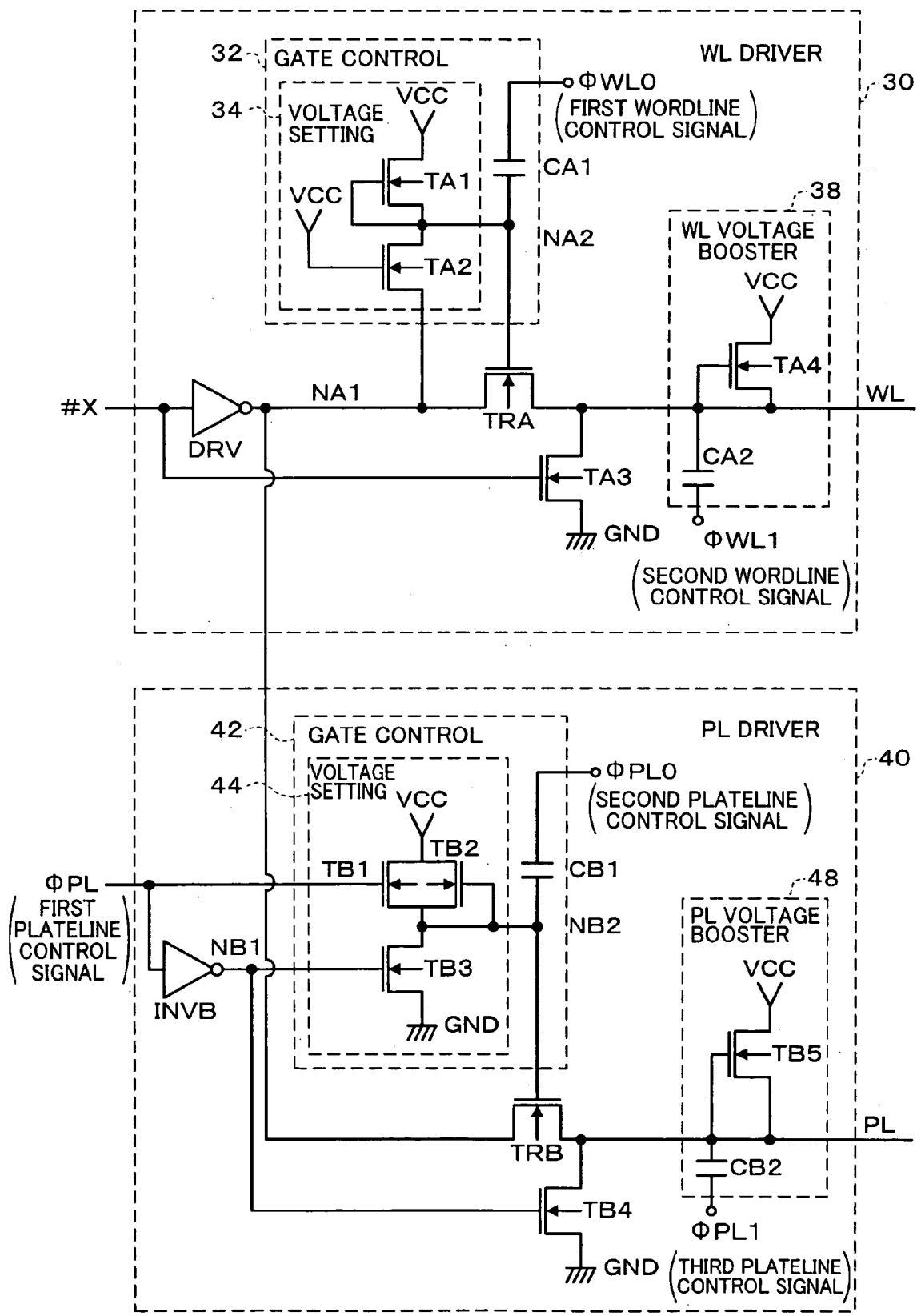
FIG. 8 is a first modification of the WL driver circuit and the PL driver circuit shown in FIG. 6.

The PL driver circuit 40 may be configured to include a PL voltage booster circuit 48 as shown in a first modification of the embodiment shown in FIG. 8. The PL voltage booster circuit 48 boosts the voltage of the plateline (K-th plateline) when a third plateline control signal ΦPL1 has become active (VCC). In the case of providing the PL voltage booster circuit 48, it is necessary to set the voltage of the node NB2 at a cutoff voltage of the transfer transistor TRB by setting the plateline control signal ΦPL0 at a GND level in advance.

The PL voltage booster circuit 48 includes a boost capacitor CB2 to which the plateline control signal ΦPL1 is supplied at one end and with which the plateline PL is connected at the other end. When a plateline control signal ΦPL1 has become active, the voltage of the plateline PL is boosted by capacitive coupling of the capacitor CB2.

The PL voltage booster circuit 48 includes an N-type transistor TB5 to which the voltage VCC is supplied at a drain and with which the plateline PL is connected at a gate and a source. The transistor TB5 functions as a circuit which clamps the voltage of the plateline PL at a given voltage level "VCC+VTB5" (VTB5 is the threshold voltage of the transistor TB5) in the same manner as the transistor TA4 of the WL voltage booster circuit 38.

A sufficient voltage can be applied to the plateline, even if the hysteresis characteristics shown in FIG. 1C deteriorate due to an imprint or fatigue, by providing the PL voltage booster circuit 48 to the PL driver circuit 40 as shown in FIG. 8, whereby a read failure or the like can be prevented.

The features of the WL driver circuit 30 and the PL driver circuit 40 according to the embodiment are summarized as follows.

(1) The wordline WL and the plateline PL are driven by using the common driver DRV (driver circuit).

(2) The wordline voltage is boosted up to the voltage VPP higher than the voltage VCC based on the signal ΦWL1 generated by the dedicated circuit (control circuit or pulse generation circuit) separately provided from the WL driver circuit 30 and the PL driver circuit 40.

(3) Since the gate voltage of the transfer transistor TRA is set at "VG=VCC−α<VCC" (T25 to T31 in FIG. 7) when boosting the wordline voltage, a leakage current from the wordline WL to the driver DRV is reduced.

(4) Since the gate voltage of the transfer transistor TRB of the PL driver circuit 40 is controlled by using the signal ΦPL0 independent of the signal ΦWL0, the WL driver circuit 30 and the PL driver circuit 40 can be operated at independent timings.

(5) A voltage which changes in the order of the first voltage level "VCC−VTA2", the second voltage level "VCC+VTA1", and the third voltage level "VCC−α" is applied to the gate of the transfer transistor TRA (T22, T23, and T24 in FIG. 7).

(6) When the signal #X and the signal ΦPL have become inactive so that the transistors TA3 and TB4 have been turned on, the wordline WL and the plateline PL are discharged to 0 V. This prevents data from being written into an unselected memory cell or from being read from an unselected memory cell.

(7) The wordline WL is set in a high impedance state after charging the wordline WL to the voltage VCC, and the wordline voltage is then boosted up to the voltage VPP using the signal ΦWL1.

(8) The gate voltage of the transfer transistor TRA is clamped at "VCC+VTA1" so that stress applied to the gate oxide film of the transfer transistor TRA is reduced.

The following effects can be obtained by the WL driver circuit 30 and the PL driver circuit 40 according to the embodiment.

(I) In the related-art technology, the wordline WL and the plateline PL are driven by using individual drivers each having a large-size transistor. In the embodiment, the wordline WL and the plateline PL can be driven by using one driver DRV having a large-size transistor. Therefore, the circuit area can be reduced in an amount corresponding to at least one driver.

(II) Since the boost operation of the wordline is controlled by using the signal ΦWL1 independent of the address decode signal #X, the boost period of the wordline voltage can be arbitrarily adjusted. This enables an adjustment which reduces damage to the gate oxide film of the transfer transistor (TR in FIG. 1A) of the memory cell.

Specifically, since the logical "1" is written into the memory cell in the period from T04 to T05 after the plateline PL has fallen as described with reference to FIG. 2A, it suffices that the wordline voltage have been boosted in the period from T04 to T05.

According to the embodiment, the logical "1" can be sufficiently written while reducing the boost period of the wordline voltage by delaying the rise timing of the signal ΦWL1 indicated by T25 in FIG. 7, e.g. by setting the rise timing of the signal ΦWL1 at a timing immediately before the timing T29. This prevents occurrence of a write failure and reduces damage to the gate oxide film of the transfer transistor (TR in FIG. 1A) of the memory cell.

(III) The gate voltage of the transfer transistor TRA can be set at "VG<VCC" by causing the signal ΦWL0 to fall after the wordline voltage has been set at the voltage VCC. Therefore, since the transfer transistor TRA has been cut off, a leakage current which flows from the wordline WL to the driver DRV can be reduced, even if the wordline voltage is boosted up to the voltage VPP.

(IV) Since the signal ΦWL0 and the signals ΦPL and ΦPL0 are independent signals, the WL & PL driver section 20 shown in FIG. 3 may be disposed at the position of the PL driver section 24 shown in FIG. 4, so that arbitrary right and left platelines can be selected by using the signals ΦPL and ΦPL0 after simultaneously selecting right and left wordlines. This further simplifies the circuit configuration.

(V) Since the signal ΦWL1 and the signal ΦPL are independent signals, a situation in which the voltage of the wordline WL is decreased by coupling when the signal ΦPL falls can be prevented.

Specifically, the signal ΦPL may be utilized to boost the voltage of the wordline WL. However, the logical "1" is written in the period from T04 to T05 after the plateline PL (ΦPL) has fallen, as described with reference to FIG. 2A. Therefore, according to the method of boosting the voltage of the wordline WL by utilizing the signal ΦPL, the boosted wordline voltage is decreased by coupling at the falling edge of the signal ΦPL (PL) in the period from T04 to T05. This makes it useless to boost the wordline voltage in order to write the logical "1".

In the embodiment, since the signal ΦWL1 for boosting the voltage of the wordline and the signal ΦPL for controlling the plateline are independent signals, the wordline voltage can be prevented from being decreased by coupling when the signal ΦPL falls.

(VI) As described later, the capacitors CA1 and CB1 to which the signals ΦWL0 and ΦPL0 are supplied or the circuit section (voltage setting circuit 44) connected with the gate of the transfer transistor TRB may be used in common between adjacent WL driver circuits or PL driver circuits. This enables the circuit scale to be further reduced in comparison with the comparative example shown in FIG. 5.

5. Modification

Figure 9:
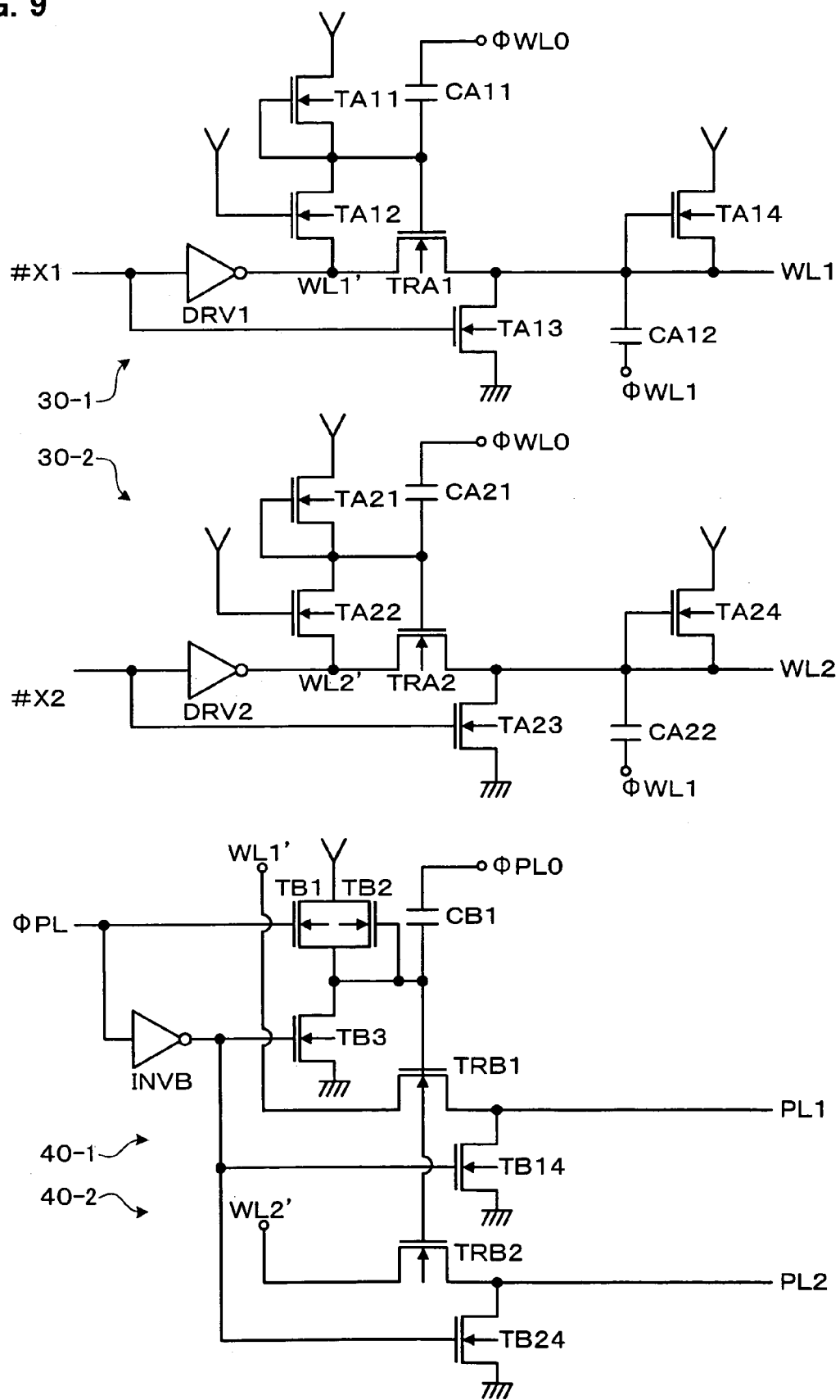
FIG. 9 is a second modification of the WL driver circuit and the PL driver circuit shown in FIG. 6.
Figure 10:
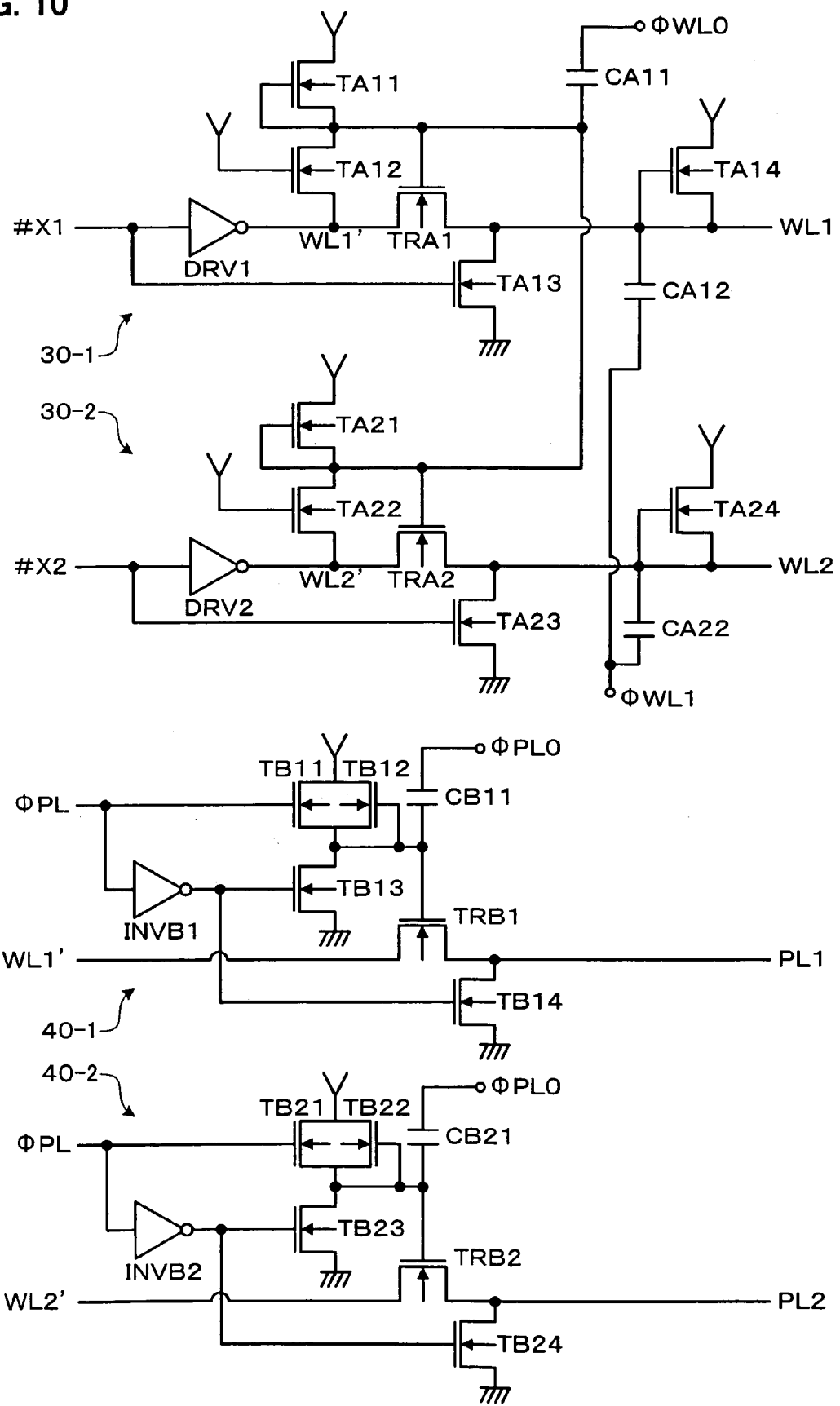
FIG. 10 is a third modification of the WL driver circuit and the PL driver circuit shown in FIG. 6.

FIGS. 9 to 11 show second, third, and fourth modifications of the embodiment relating to common use of the circuit. In the second modification shown in FIG. 9, while the circuit is not used in common between the WL driver circuits 30-1 and 30-2, the circuit is used in common between the PL driver circuits 40-1 and 40-2. In more detail, the gate control capacitor CB1, the transistors TB1, TB2, TB3 (voltage setting circuit), and the inverter circuit INVB are used in common between the PL driver circuits 40-1 and 40-2. This is because the signal change timing of the plateline control signal ΦPL0 may be set at the same timing for the PL driver circuits 40-1 and 40-2.

As shown in FIG. 9, the PL driver circuit 40-1 drives the plateline PL1 using the driver DRV1 (drive node WL1') of the WL driver circuit 30-1 which drives the wordline WL1 corresponding to the plateline PL1. The PL driver circuit 40-2 drives the plateline PL2 using the driver DRV2 (drive node WL2') of the WL driver circuit 30-2 which drives the wordline WL2 corresponding to the plateline PL2.

In the third modification shown in FIG. 10, while the circuit is not used in common between the PL driver circuits 40-1 and 40-2, the circuit is used in common between the WL driver circuits 30-1 and 30-2. In more detail, a gate control capacitor CA11 is used in common between the WL driver circuits 30-1 and 30-2. This is because the signal change timing of the wordline control signal ΦWL0 may set at the same timing for the WL driver circuits 30-1 and 30-2.

In the fourth modification shown in FIG. 11, the circuit is used in common between the PL driver circuits 40-1 and 40-2, and the circuit is also used in common between the WL driver circuits 30-1 and 30-2.

In the comparative example shown in FIG. 5, it is difficult to make the circuit used in common among the WL driver circuits or the PL driver circuits. According to the embodiment, since the circuit can be used in common among the WL driver circuits or the PL driver circuits as shown in FIGS. 9 to 11, the circuit scale can be further reduced in comparison with the comparative example. FIGS. 9 to 11 illustrate the case where the circuit is used in common among two WL driver circuits or two PL driver circuits. However, the circuit may be used in common among three or more WL driver circuits or three or more PL driver circuits.

The invention is not limited to the above-described embodiments. Various modifications and variations may be made within the scope of the invention. For example, any term (such as N-type, 0 V (GND), and VCC) cited with a different term having broader or the same meaning (such as first conductivity type, first power supply, and second power supply) at least once in this specification and drawings can be replaced by the different term in any place in this specification and drawings.

The configurations of the wordline (WL) driver circuit and the plateline (PL) driver circuit are not limited to the configurations described with reference to FIG. 6 and the like. For example, the configuration of the gate control circuit is not limited to the configuration shown in FIG. 6. The timings of the wordline control signal and the plateline control signal are not limited to the timings shown in FIG. 7. A configuration in which the plateline is not driven by using the driver of the wordline driver circuit may be employed. The configuration and the arrangement position of the wordline voltage booster circuit which boosts the voltage of the wordline are not limited to the configuration and the arrangement position shown in FIG. 6 and the like. The ferroelectric memory may be utilized as the logic circuit.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A ferroelectric memory, comprising:
a memory cell array in which a plurality of memory cells are disposed, each of the memory cells including a ferroelectric capacitor;
a plurality of wordlines;
a plurality of platelines; and
a plurality of wordline driver circuits,
wherein a K-th wordline driver circuit among the plurality of wordline driver circuits includes:
a driver which drives a K-th wordline;
a transfer transistor provided between the driver and the K-th wordline; and
a gate control circuit which performs gate control of the transfer transistor, and
wherein the gate control circuit performs gate control which causes the transfer transistor to be turned on, and performs gate control which causes the transfer transistor to be turned off to set the K-th wordline in a high impedance state, before a voltage of the K-th wordline is boosted after the transfer transistor has been turned on and the K-th wordline has been driven by the driver,
wherein the driver drives a K-th plateline corresponding to the K-th wordline after the transfer transistor has been turned off.

2. The ferroelectric memory as defined in claim 1,
wherein the gate control circuit performs gate control which causes the transfer transistor to be turned on when the K-th wordline has been selected by an address decode signal and a first wordline control signal has become active, and performs gate control which causes the transfer transistor to be turned off when the first wordline control signal has become inactive.

3. The ferroelectric memory as defined in claim 2,
wherein the K-th wordline driver circuit includes a wordline voltage booster circuit, and
wherein the wordline voltage booster circuit boosts the voltage of the K-th wordline when a second wordline control signal has become active.

4. The ferroelectric memory as defined in claim 3,
wherein the wordline voltage booster circuit includes a boost capacitor to which the second wordline control signal is supplied at one end and with which the K-th wordline is connected at the other end.

5. A ferroelectric memory, comprising:
a memory cell array in which a plurality of memory cells are disposed, each of the memory cells including a ferroelectric capacitor;
a plurality of wordlines;
a plurality of platelines; and
a plurality of wordline driver circuits, wherein a K-th wordline driver circuit among the plurality of wordline driver circuits includes:
a driver which drives a K-th wordline;
a transfer transistor provided between the driver and the K-th wordline; and
a gate control circuit which performs gate control of the transfer transistor, and
wherein the gate control circuit performs gate control which causes the transfer transistor to be turned on, and performs gate control which causes the transfer transistor to be turned off to set the K-th wordline in a high impedance state, before a voltage of the K-th wordline is boosted after the transfer transistor has been turned on and the K-th wordline has been driven by the driver,
wherein the gate control circuit includes:
a voltage setting circuit which sets a gate node of the transfer transistor at a first voltage level when an address decode signal has become active and the K-th wordline has been selected; and
a gate control capacitor to which a first wordline control signal is supplied at one end and with which the gate node is connected at the other end, and
wherein the gate control capacitor sets the gate node at a second voltage level by capacitive coupling when the first wordline control signal has become active after the gate node has been set at the first voltage level, and sets the gate node at a third voltage level, which causes the transfer transistor to be turned off, by capacitive coupling when the first wordline control signal has become inactive after the gate node has been set at the second voltage level.

6. The ferroelectric memory as defined in claim 5,
wherein the gate control capacitor is used in common among the wordline driver circuits.

7. The ferroelectric memory as defined in claim 5,
wherein the voltage setting circuit includes a clamp circuit which clamps a voltage of the gate node so that the voltage of the gate node does not become higher than a given voltage level.

8. A method of driving a ferroelectric memory which includes a memory cell array in which a plurality of memory cells are disposed, a plurality of wordlines, and a plurality of platelines, each of the memory cells including a ferroelectric capacitor, the method comprising:

performing gate control which causes a transfer transistor to be turned on, the transfer transistor being provided between a K-th wordline and a driver which drives the K-th wordline; and
performing gate control which causes the transfer transistor to be turned off to set the K-th wordline in a high impedance state, before a voltage of the K-th wordline is boosted after the transfer transistor has been turned on and the K-th wordline has been driven by the driver,
wherein the driver drives a K-th plateline corresponding to the K-th wordline after the transfer transistor has been turned off.

9. A method of driving a ferroelectric memory which includes a memory cell array in which a plurality of memory cells are disposed, a plurality of wordlines, and a plurality of platelines, each of the memory cells including a ferroelectric capacitor, the method comprising:

performing gate control which causes a transfer transistor to be turned on, the transfer transistor being provided between a K-th wordline and a driver which drives the K-th wordline;
performing gate control which causes the transfer transistor to be turned off to set the K-th wordline in a high impedance state, before a voltage of the K-th wordline is boosted after the transfer transistor has been turned on and the K-th wordline has been driven by the driver;
setting a gate node of the transfer transistor at a first voltage level when an address decode signal has become active and the K-th wordline has been selected;
providing a gate control capacitor to which a first wordline control signal is supplied at one end and with which the gate node is connected at the other end;
setting the gate node at a second voltage level by capacitive coupling from the gate control capacitor when the first wordline control signal has become active after the gate node has been set at the first voltage level; and
setting the gate node at a third voltage level, which causes the transfer transistor to be turned off, by capacitive coupling from the gate control capacitor when the first wordline control signal has become inactive after the gate node has been set at the second voltage level.

* * * * *